(12) United States Patent
Rajagopalan et al.

(10) Patent No.: US 6,586,825 B1
(45) Date of Patent: Jul. 1, 2003

(54) DUAL CHIP IN PACKAGE WITH A WIRE BONDED DIE MOUNTED TO A SUBSTRATE

(75) Inventors: Sarathy Rajagopalan, Fremont, CA (US); Kishor Desai, Fremont, CA (US); Maniam Alagaratnam, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/843,443

(22) Filed: Apr. 26, 2001

(51) Int. Cl.[7] .......................... H05K 1/16; H01L 23/24; H01L 23/48; H01L 23/02; H01L 29/40
(52) U.S. Cl. ...................... 257/686; 257/723; 257/777; 257/668; 257/685; 257/786; 257/784; 257/737; 257/738; 257/692; 257/693; 257/778; 257/700; 257/701; 257/783
(58) Field of Search ................................. 257/686, 685, 257/723, 777, 778, 786, 784, 700, 701, 758, 737, 738, 692, 693, 783

(56) References Cited

U.S. PATENT DOCUMENTS

| 5,286,926 | A | * | 2/1994 | Kimura et al. ............... 174/250 |
| 5,322,593 | A | * | 6/1994 | Hasegawa et al. ........... 156/633 |
| 5,942,795 | A | * | 8/1999 | Hoang ......................... 257/692 |
| 6,091,194 | A | * | 7/2000 | Swirbel et al. .............. 313/498 |
| 6,121,689 | A | * | 9/2000 | Capote et al. ............... 257/783 |
| 6,181,002 | B1 | * | 1/2001 | Juso et al. ................... 257/686 |
| 6,271,598 | B1 | * | 8/2001 | Vindasius et al. ........... 257/777 |
| 6,288,559 | B1 | * | 9/2001 | Bernier et al. ............... 324/755 |
| 6,300,576 | B1 | * | 10/2001 | Nakamura et al. .......... 174/261 |
| 6,340,846 | B1 | * | 1/2002 | Lobianco et al. ............ 257/777 |
| 6,352,879 | B1 | * | 3/2002 | Fukui et al. ................. 438/106 |
| 6,362,518 | B1 | * | 3/2002 | Yatsuda ....................... 257/678 |
| 6,400,019 | B1 | * | 6/2002 | Hirashima et al. .......... 257/737 |
| 6,414,384 | B1 | * | 7/2002 | Lo et al. ...................... 257/685 |
| 2001/0029666 | A1 | * | 10/2001 | Nakamura et al. ............ 29/846 |
| 2002/0030263 | A1 | * | 3/2002 | Akram ........................ 257/686 |
| 2002/0056897 | A1 | * | 5/2002 | Yatsuda ....................... 257/678 |
| 2002/0096746 | A1 | * | 7/2002 | Cokely et al. ............... 257/666 |

FOREIGN PATENT DOCUMENTS

JP            8-255980         * 10/1996

* cited by examiner

*Primary Examiner*—Alexander O. Williams
(74) *Attorney, Agent, or Firm*—Westman, Champlin & Kelly

(57) ABSTRACT

A package comprises a top die and a bottom die. The top die has top and bottom surfaces while the bottom die has top and bottom surfaces. The bottom die is mounted on a substrate, which has a top surface, such that the bottom surface of the bottom die faces the top surface of the substrate. The bottom surface of the top die is separated from the top surface of the bottom die by an interposer, which creates a space between the exterior regions of the top surface of the bottom die and the bottom surface of the top die. Each of a plurality of wires, which are electrically connected to the bottom die, runs through this space (i.e. runs between the top surface of the bottom die and the bottom surface of the top die), thereby permitting (if desired) the top die to be at least as large as the bottom die.

37 Claims, 7 Drawing Sheets

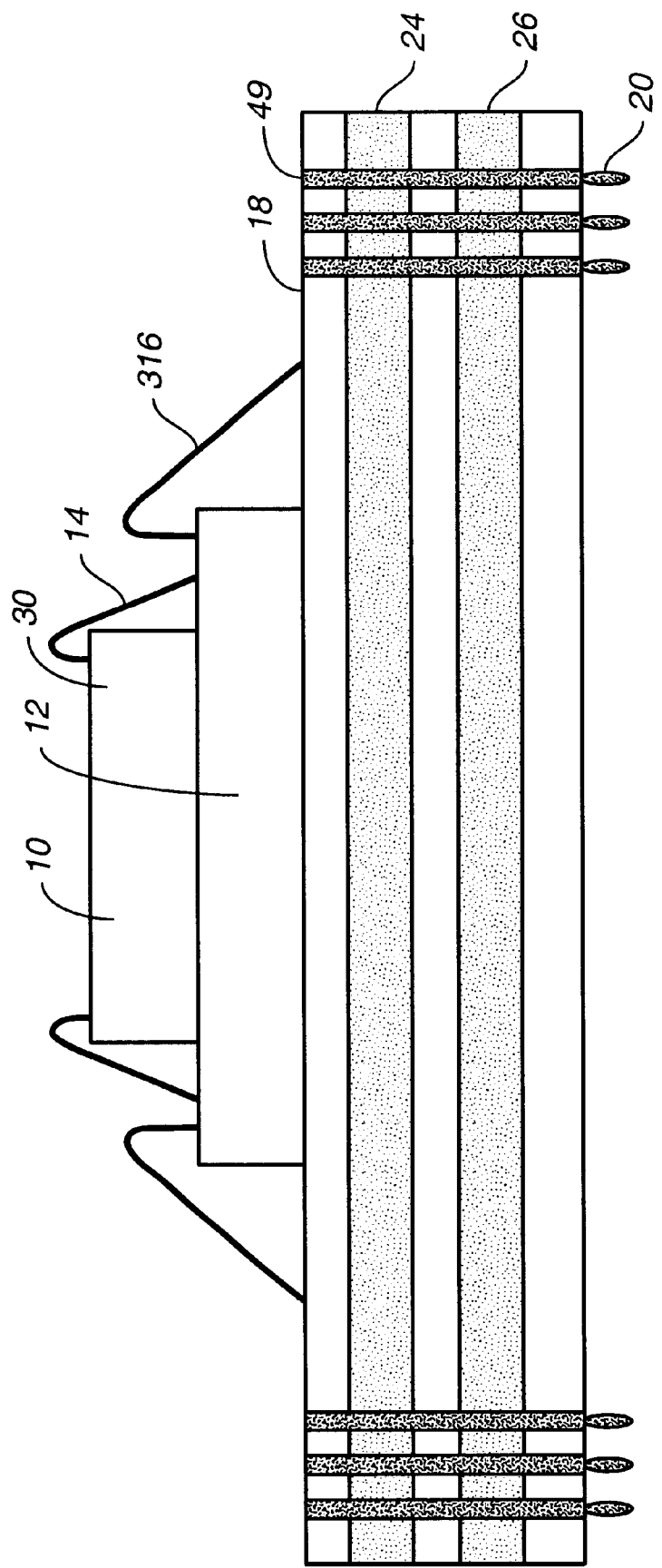
FIG._1

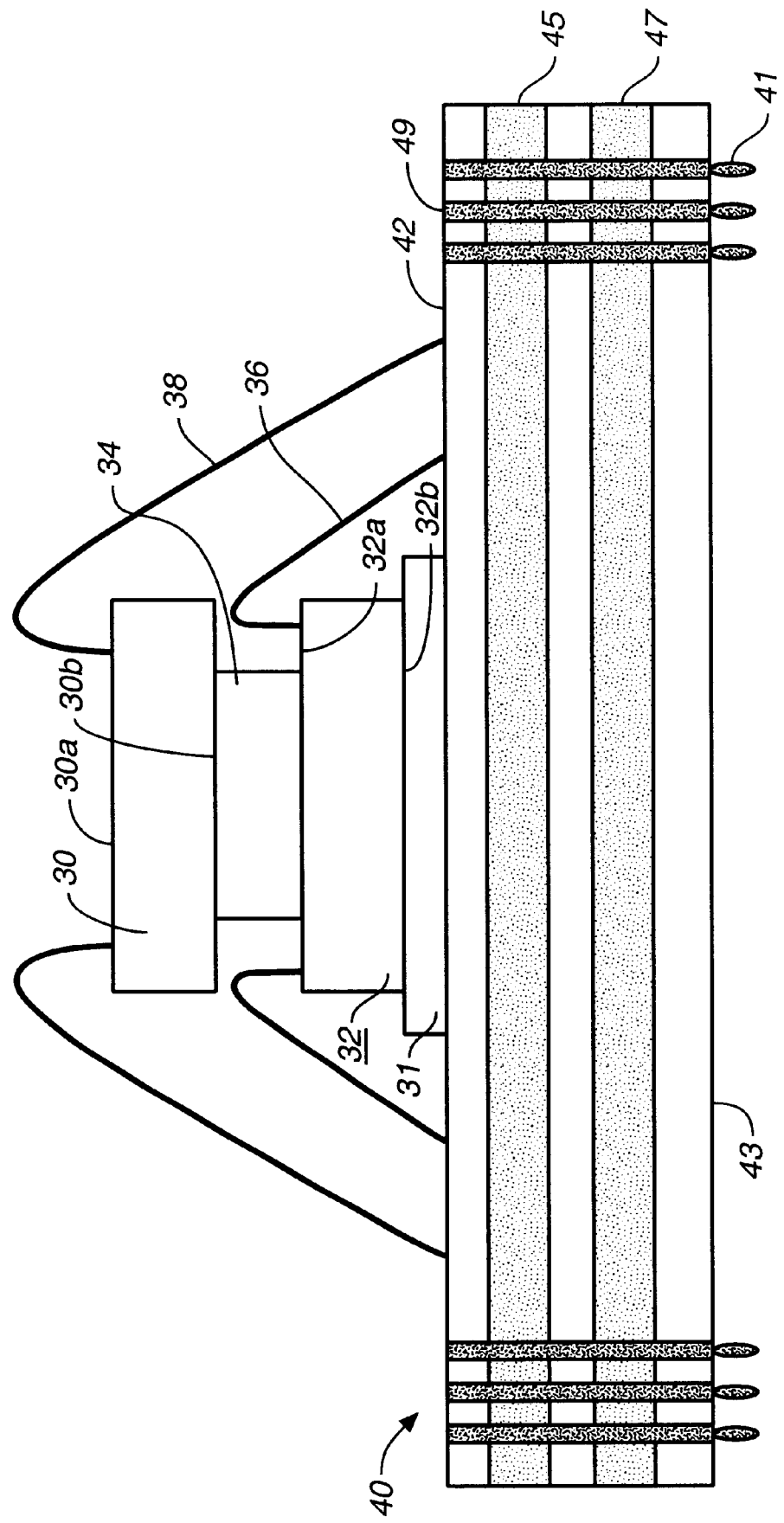
FIG._2

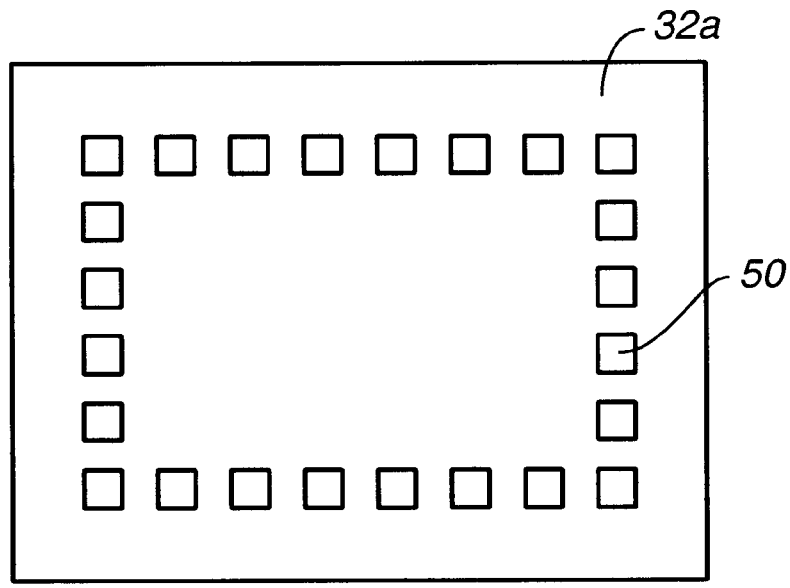
FIG._3a
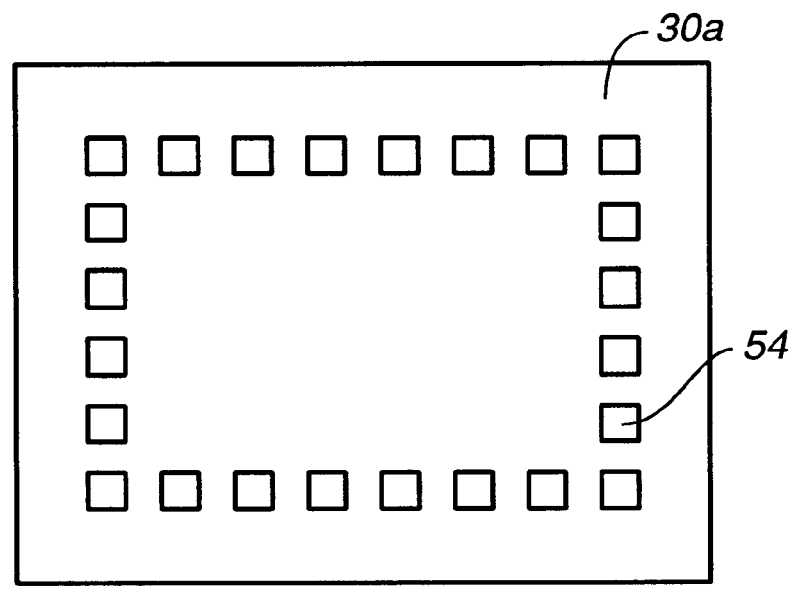
FIG._3b

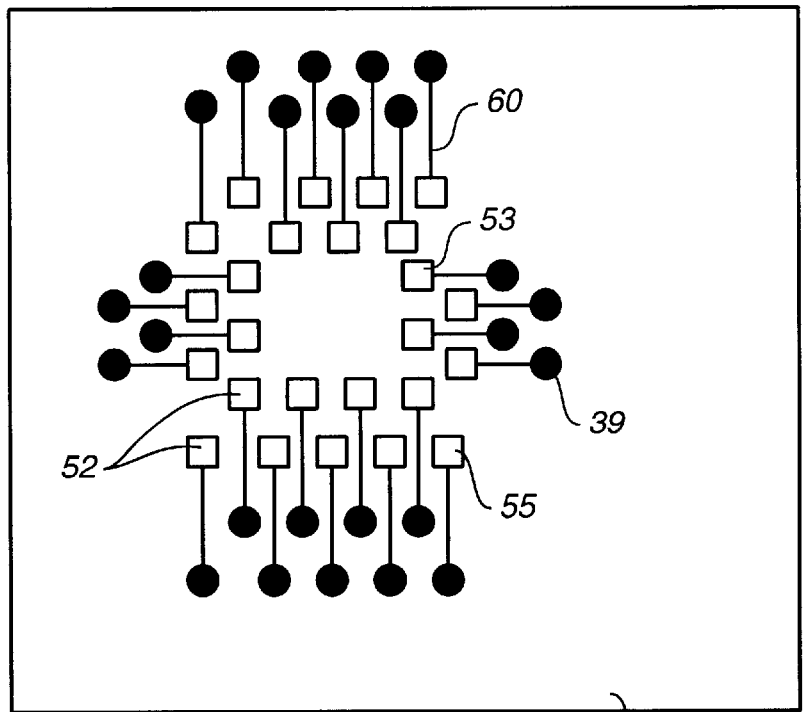
FIG._4a
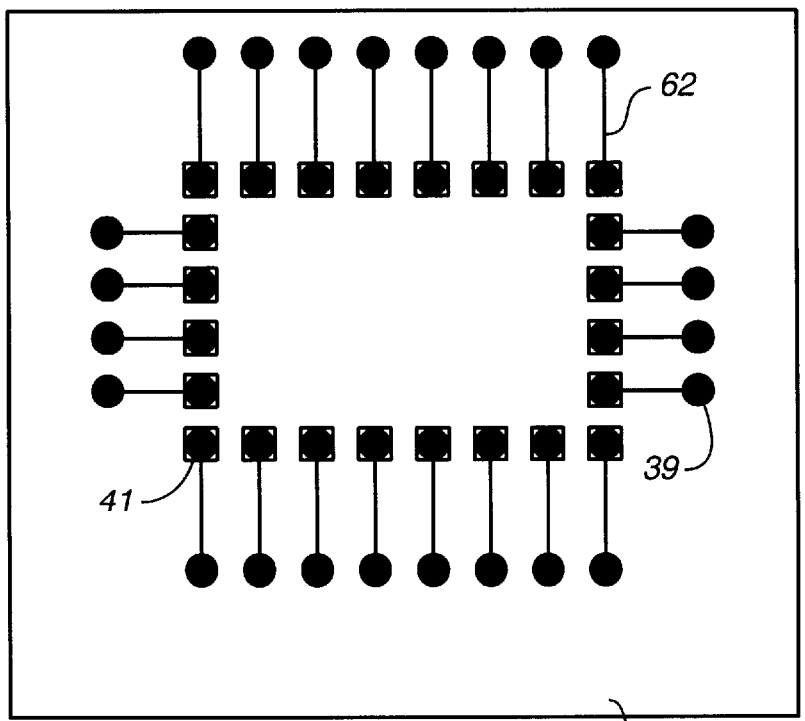
FIG._4b

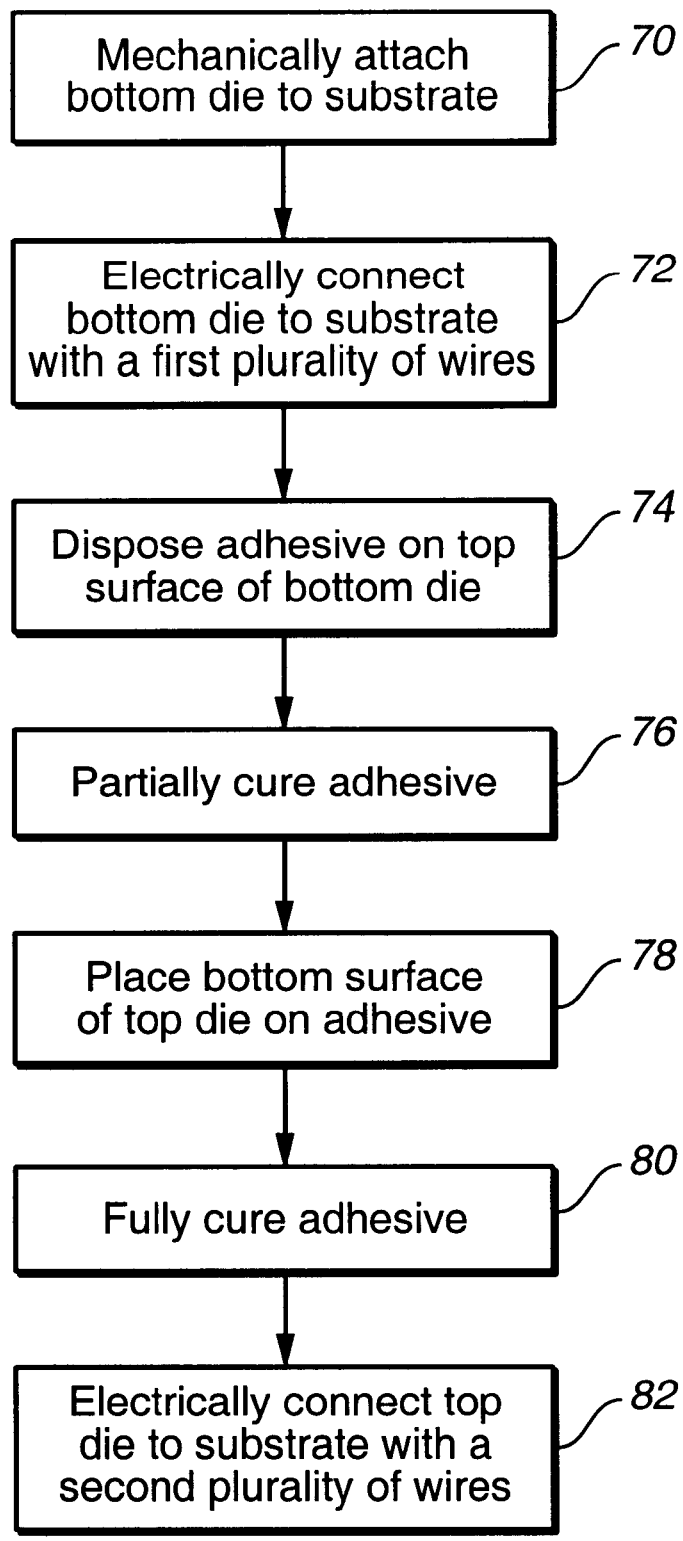
FIG._5

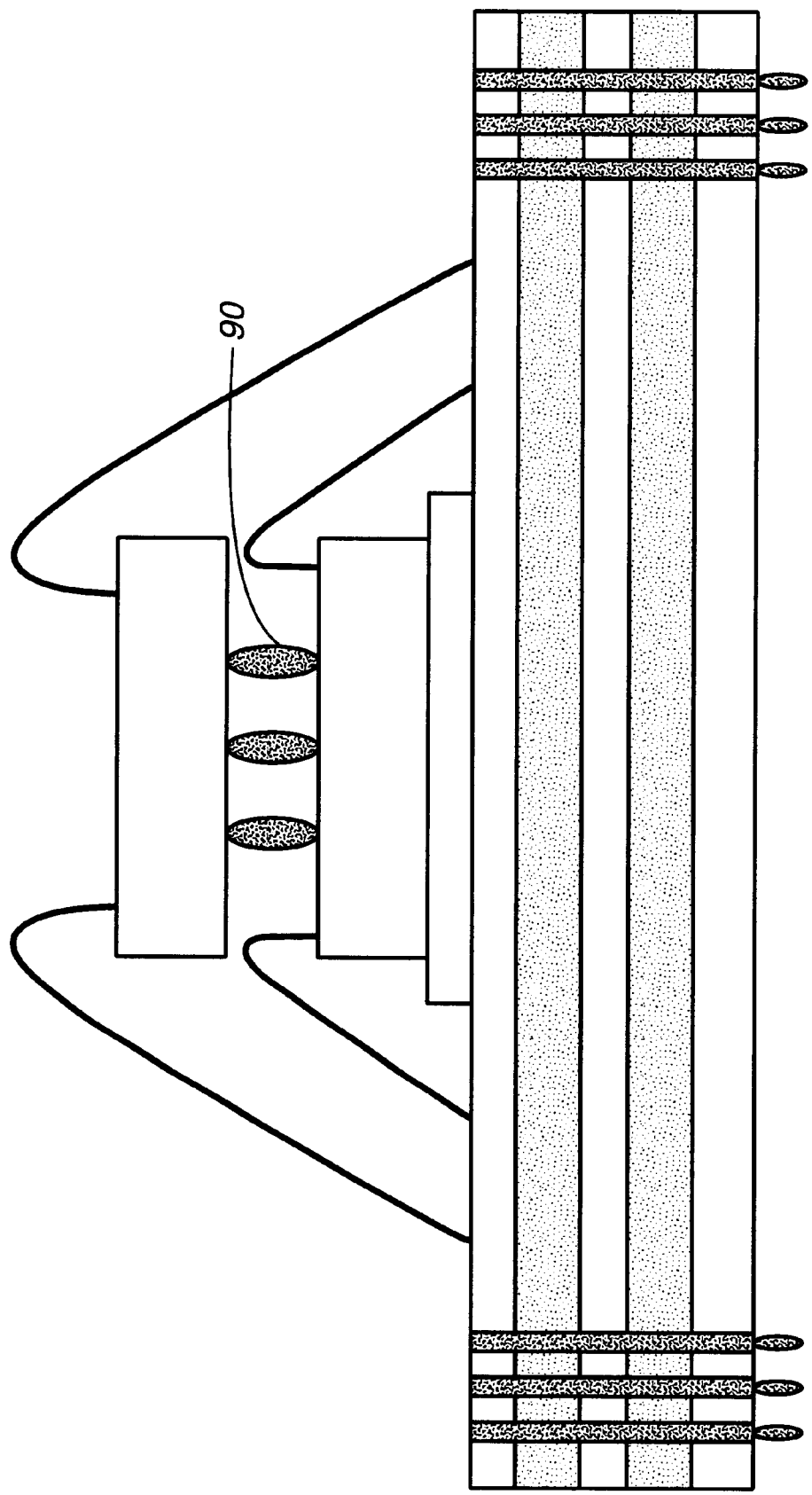
FIG._6

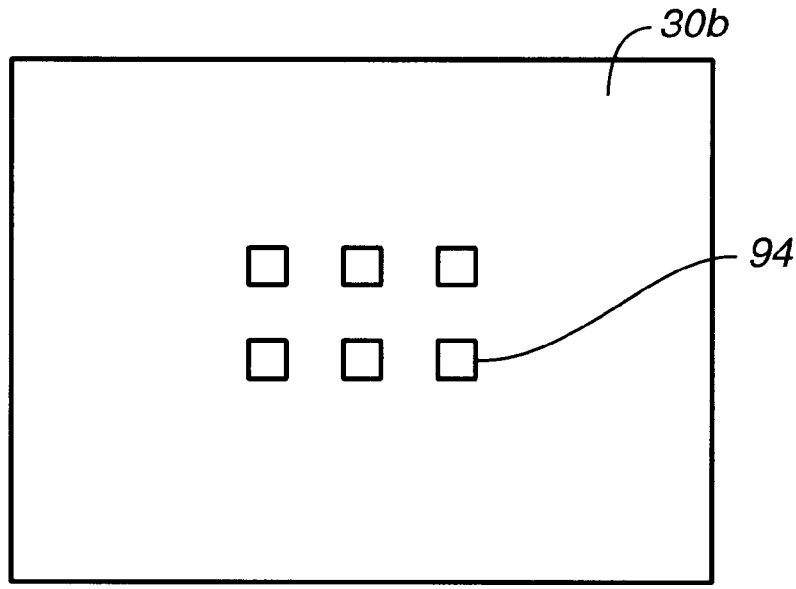
FIG._7a
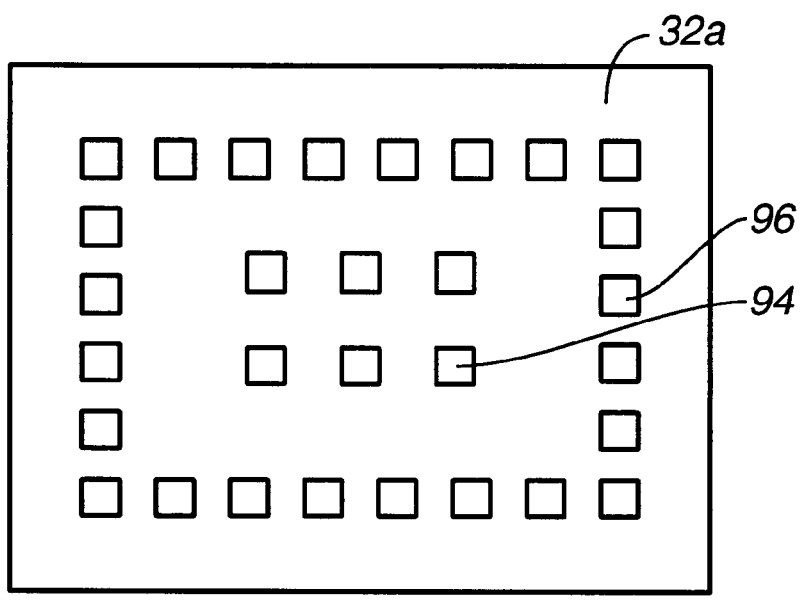
FIG._7b

DUAL CHIP IN PACKAGE WITH A WIRE BONDED DIE MOUNTED TO A SUBSTRATE

FIELD OF THE INVENTION

The invention relates generally to semiconductor packaging. More specifically, the invention relates to the design and manufacturing process of a semiconductor package that allows the incorporation of more than one chip device into a single package.

BACKGROUND OF THE INVENTION

For a variety of reasons well known in the art, semiconductor packages that have more than one chip, otherwise known as multi-chip modules ("MCM's"), are becoming increasingly popular. One type of MCM is shown in FIG. 1. The MCM shown in FIG. 1 comprises a top die 10 stacked on top of a bottom die 12, which is in turn mounted on a substrate 18. Bond pads (not shown) on the top die 10 and the bottom die 12 serve to interface the signal/power/ground outputs of the top and bottom dies 10 and 12 to an external device. Specifically, to electrically connect bond pads on the top die 10 to the substrate 18, a first plurality of wires 14 run from the top die to the bottom die 12, and a second plurality of wires 16, some of which are electrically coupled to the first plurality of wires 14, run from the bottom die to the substrate 18. The remainder of the second plurality of wires couple the first semiconductor die's own signal/power/ground outputs to the substrate 18.

From the top surface of the substrate 18, signals are routed through a plurality of vias such as via 22 and/or along layers within the substrate 18 and thence to a plurality of solder balls 20 on the bottom surface of the substrate 18.

The plurality of solder balls 20 are in turn connected to an external circuit board (not shown), thereby connecting the signal/power/ground outputs from the top and bottom semiconductor dies 10 and 12 to the external circuit board.

The MCM shown in FIG. 1 has at least one significant drawback. In particular, the bottom die 12 must be larger than the top die 10 to accommodate the first plurality of wires 14 (and the corresponding plurality of bond pads on the bottom die 12). Thus, two dies that are equal in size (i.e. surface area of relevant surfaces), or whose sizes differ by no more than a certain amount, may not be stacked in an MCM such as the one shown in FIG. 1. (With current die sizes known to the inventors hereof, the bottom die 12 must be at least 2 mm longer than the top die 10 along each of the four edges of the dies 10 and 12 such that the bottom die 12 must have a surface area at least 4 mm×4 mm, or 16 mm², greater than the top die.) This is a significant constraint since it is often desirable to stack two similarly sized dies in an MCM.

A designer of a package such as that shown in FIG. 1 who desires to stack dies that would otherwise be similarly sized has to increase the size of one of them such that the sizes differ by no more than the maximum allowable size difference. Larger die sizes result in larger package sizes, which is undesirable. Further, larger die sizes mean that the number of dies per semiconductor wafer is lower, which increases manufacturing costs.

One possible scheme for stacking two die in a package is disclosed in U.S. patent application Ser. No. 09/467,543 is entitled "Dual Chip in Package," filed Dec. 10, 1999, and is owned by the assignee of the present invention. According to this scheme, a top die and a bottom die are separated by an interposer. The bottom die is mounted flip-chip style on a substrate while the top die is wire bonded to the substrate. Unlike the package shown in FIG. 1, since the bottom die is flip chip mounted to the substrate, it does not have any bond wires that must be accommodated, thereby avoiding the, problems associated with the package shown in FIG. 1. Although the package shown in the '543 application is effective, it is often desirable to have a bottom die that is wire bonded to the substrate.

Therefore, there is a need for an MCM package with a bottom die that is wire bonded to a substrate and a top die that is approximately the same size as the bottom die.

SUMMARY OF THE INVENTION

To achieve the foregoing, the present invention provides an apparatus and method for manufacturing a multi-chip module that comprises two similarly or identically sized dies. Although the present invention meets the above mentioned need pertaining to similarly or identically sized dies, the present invention may also have utility in cases where the dies have substantially different sizes.

According to one embodiment of the present invention, a package comprises two similarly size dies, a top die and a bottom die. The top die has top and bottom surfaces and the bottom die has top and bottom surfaces. The bottom die is mounted on a substrate, which has a top surface, such that the bottom surface of the bottom die faces the top surface of the substrate. Preferably, a thermally conductive adhesive is disposed between the bottom surface of the bottom die and the top surface of the substrate. The top die and bottom die are electrically connected to the substrate by wires. In turn, the substrate comprises a plurality of solder balls that electrically connect the substrate, and therefore the top die and bottom die, with an external device.

The bottom surface of the top die is separated from the top surface of the bottom die by an interposer. Thus, the interposer creates a space between the exterior regions of the top surface of the bottom die and the bottom surface of the top die. The wires that are electrically connected to the bottom die run through this space (i.e. run between the top surface of the bottom die and the bottom surface of the top die). Allowing these wires to run underneath the top die enables the top die to be at least as large as the bottom die.

BRIEF DESCRIPTION OF THE DRAWINGS

FIG. 1 is a cross sectional view of a wire bond based prior art multi-chip module package.

FIG. 2 is a cross sectional view of an embodiment of a wire bond based multi-chip module package constructed according to the teachings of the present invention.

FIGS. 3a and 3b are overhead views of the top surfaces of the top and bottom dies, respectively, shown in FIG. 2.

FIGS. 4a and 4b are overhead views of the top and bottom surfaces, respectively, of the substrate shown in FIG. 2.

FIG. 5 is a flow chart that describes on possible method for constructing the package shown in FIG. 2.

FIG. 6 is a cross sectional view of another possible embodiment of a wire bond based multi-chip module package constructed according to the teachings of the present invention.

FIGS. 7a and 7b are overhead views of the bottom surface of the top die and the top surface of the bottom die, respectively, shown in FIG. 6.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF ILLUSTRATIVE EMBODIMENTS

1. Definitions

The "connection" of two items by a third item means that the two items are coupled by some means that includes, without limitation, the third item. This definition applies to all conjugates of "connect." For example, a first bond pad is said to be "connected" to a second bond pad by a wire, even if the wire is attached to the first bond pad but not the second bond pad (i.e. some instrumentality attached to the wire "connects" the wire to the second bond pad).

A die is said to be "mounted" to a substrate if it is mechanically coupled to the substrate, regardless of whether other items (e.g. another die) are between the "mounted" die and the substrate.

An "interposer" disposed between two dies is any instrumentality that is mechanically attached to both dies. An "interposer" need not be unitary. For example, a plurality of solder balls disposed between two dies is an "interposer".

2. Description

FIG. 2 shows a cross sectional view of a semiconductor package housing two similarly size die, a top die 30 and a bottom die 32. The top die 30 has top and bottom surfaces 30a and 30b respectively while the bottom die 32 has top and bottom surfaces 32a and 32b respectively. The bottom die 32 is mounted on a substrate 40, which has a top surface 42, such that the bottom surface 32b of the bottom die faces the top surface 42 of the substrate 40. Preferably, a thermally conductive adhesive 31 is disposed in between the bottom surface 32b of the bottom die faces the top surface 42 of the substrate 40. The top die 30 and bottom die 32 are electrically connected to the substrate 40, as will be further described below. In turn, the substrate 40 comprises a plurality of solder balls 41 that electrically connect the substrate 40, and therefore the top die 30 and bottom die 32, with an external device (not shown), Although FIG. 2 shows the top die 30 as approximately the same size as the bottom die 32, it will be appreciated that the present invention may be useful in situations where the top die 30 is either smaller or larger than the bottom die 32. It will also be appreciated that the present invention may be useful in connection with stacking more than two dies and that the dies need not necessarily be parallel to one another.

As shown in the Figure, the bottom surface 30b of the top die 30 is separated from the top surface 32a of the bottom die 32 by an interposer 34. The interposer 34 preferably comprises an adhesive but may comprise any material. The interposer 34 creates a space between the exterior regions of the top surface 32a of the bottom die 32 and the bottom surface 30b of the top die 30. Each of a first plurality of wires 36, which are electrically connected to the bottom die 32 (as will be further described below), runs through this space. In other words,each of the first plurality of wires 36 runs between the top surface 32a of the bottom die 32 and the bottom surface 30b of the top die 30. (More specifically, each of the first plurality of wires 36 passes through at least one plane that is bounded by both a line segment along the top surface 32a of the bottom die 32 and a line segment along the bottom surface 30b of the top die 30).

FIGS. 3a and 3b, respectively, show the top surface 32a of the bottom die 32 and the top surface 30a of the top die 30, respectively. As shown in FIG. 3a, a first plurality of die bond pads 50 are arrayed in a rectangular shape on the exterior region of the top surface 32a of the bottom die 32. As shown in FIG. 3b, a second plurality of die bond pads 54 are arrayed in a rectangular shape on the exterior region of the top surface 30a of the top die 30.

FIG. 4a shows the top surface 42 of the substrate 40. As shown, a plurality of substrate bond pads 52 comprises a first group of substrate bond pads 53 and a second group of substrate bond pads 55, each of which is arrayed in a rectangular shape. As shown, the first group of substrate bond pads and the second group of substrate bond pads are interleaved with one another. Referring to FIGS. 2, 3a and 4a, each of the first plurality of wires 36 (FIG. 2) is attached to a corresponding one of first plurality of die bond pads 50 top surface 32a of the bottom die 32 (FIG. 3a) and a corresponding one of the first group of substrate bond pads 53 (FIG. 4a). Referring to FIGS. 2, 3b and 4a, each of a second plurality of wires 38 (FIG. 2) is attached to a corresponding one of second plurality of die bond pads 54 on the top surface 30a of the top die 30 (FIG. 3b) and a corresponding one of the second group of substrate bond pads 55 (FIG. 4a). In this manner both the top die 30 and the bottom die 32 are electrically connected to the substrate 40.

Referring to FIG. 2 once again, the substrate 40 preferably comprises a plurality of layers interconnected by a plurality of vias 49. The plurality of layers includes the top surface 42, a bottom surface 43 and layers 45 and 47, which may comprise power: and/or ground planes and/or signal routing traces. It will be appreciated that any number of layers may be used. The plurality of solder balls 41, disposed on the bottom surface 43, electrically couples the substrate 40 to an external device (not shown), thereby electrically connecting the top die 30 and bottom die 32 to the external device.

Referring to FIG. 4a once again, each of a first plurality of traces 60, disposed on the top surface 42, connects one of the plurality of substrate bond pads 52 on the top surface 42 with one of the plurality of vias 49. As shown in FIG. 2, each of the plurality of vias 39 connects one layer of the substrate 40 with another layer of the substrate 40. At least some of the plurality of vias 49 run to the bottom surface 43.

FIG. 4b shows the bottom surface 43 of the substrate 40. As shown in the Figure, each a second plurality of traces 62 disposed on the bottom surface 43 electrically connects one of the plurality of vias 49 with one of the plurality of solder balls 41. Substrate routing schemes are well known and will not be discussed here in greater detail.

FIG. 5 is a flow chart that outlines one possible method for constructing the package shown in FIG. 2 where an adhesive is employed for the interposer 34. According to step 70, the bottom die 32 is mechanically attached to the substrate 40. Next, according to step 72, the bottom die 32 is electrically connected to the substrate 40 by the first plurality of wires 36. Next, an adhesive is disposed on the top surface 32a of the bottom die 32. The amount of adhesive is preferably selected such that it does not come into contact with any of the first plurality of wires 36 or first plurality of die bond pads 50. Also, the adhesive must be thick enough to raise the bottom surface 30bof the top die 30 above each of the second plurality of wires 38. A typical-thickness, for the adhesive (interposer 34) is 10 mils (0.010 inches) although the actual thickness for any particular package, the thickness will depend on die width, wire height etc. The adhesive may be dispensed in many ways. For example, it may be dispensed as a single drop (a "die drop."). Alternatively, it may be dispensed in multiple drops by a jet dispenser, which results in a package shown in FIG. 6. Other adhesive dispensing techniques may be employed. Similarly, many different types of adhesives may be employed such as Honeywell MC7200 or some type of thermally conductive adhesive, which would serve to dissipate heat.

In step 74, the adhesive is partially cured; preferably, the adhesive (interposer 34) is cured such that its consistency provides a soft seat for the top die 30. In step 76, the bottom surface 30b of the top die 30 is placed on the adhesive (interposer 34). In step 78, the adhesive is fully cured. In step 80, the top die 30 is electrically connected to the substrate 40 by the second plurality of wires 38.

As previously mentioned in connection with the flow chart shown in FIG. 5, a plurality of drops of adhesive may be dispensed on the top surface 32a of the bottom die 32, which results in the configuration shown in FIG. 6. FIG. 6 is identical to FIG. 2 except for the interface between the bottom surface 30b of the top die 30 and the top surface 32a of the bottom die 32. FIGS. 7a and 7b, respectively, show versions of the bottom surface 30b of the top die 30 and the top surface 32a of the bottom die 32 that are modified to conform to the embodiment shown in FIG. 6.

To enable the bottom die 32 and top die 30 to communicate with one another, an adhesive comprises a plurality of drops 90 that are each electrically conducting, such that each of the plurality of drops 90 connects a corresponding one of a first plurality of interior bond pads 92 disposed on the interior of the bottom surface 30b of the top die 30 (see FIG. 7a) with a corresponding one of a second plurality of interior bond pads 94 disposed on the top surface 32a of the bottom die 32 (see FIG. 7b). As shown in FIG. 7b, the top surface 32a of the bottom die 32 also has a third plurality of die pads 96, which are analogous to the first plurality of die pads 50 (see FIG. 4a), disposed thereon.

Although the foregoing invention has been described in detail to facilitate an understanding thereof, it will be apparent that certain changes and modifications may be practiced within the scope of the appended claims.

What is claimed is:

1. A semiconductor package comprising:
   a packaging substrate having a top surface having a plurality of substrate bond pads thereon;
   a first semiconductor die having a top surface and a bottom surface and having a first bond pad and a third bond pad, both on its top surface;
   a first wire connecting the first bond pad to a first one of the plurality of substrate bond pads;
   a second semiconductor die having a top surface and a bottom surface and having a second bond pad on its top surface and a fourth bond pad on its bottom surface;
   a second wire connecting the second bond pad to a second one of the plurality of substrate bond pads; and
   an interposer between the top surface of the first semiconductor die and the bottom surface of the second semiconductor die, comprising an electrically conductive material attached to both the third bond pad and the fourth bond pad.

2. The semiconductor package of claim wherein the interposer comprises an adhesive.

3. The semiconductor package of claim 1 wherein the first semiconductor die is mounted to the substrate such that the bottom surface of the first semiconductor die faces the top surface of the substrate.

4. The semiconductor package of claim 3 further comprising a thermally conductive adhesive disposed between the bottom surface of the first semiconductor die and the top surface of the substrate.

5. The semiconductor package of claim 3 wherein the interposer is positioned such that a space exists between an exterior region of the top surface of the first semiconductor die and an exterior region of the bottom surface of the second semiconductor die, and wherein a portion of the first wire runs through the space.

6. The semiconductor package of claim 1 wherein:
   the first bond pad is one of a first plurality of die bond pads on the top surface of the first semiconductor die;
   the first wire is one of a first plurality of wires, each of the first plurality of wires connecting a corresponding one of the first bond pad to a corresponding one of the plurality of substrate bond pads;
   the second bond pad is one of a second plurality of die bond pads on the top surface of the second semiconductor die;
   the second wire is one of a second plurality of wires, each of the second plurality of wires connecting a corresponding one of the second bond pad to a corresponding one of the plurality of substrate bond pads;
   the first semiconductor die is mounted to the substrate such that the bottom surface of the first semiconductor die faces the top surface of the substrate; and
   the interposer is positioned such that a space exists between an exterior region of the top surface of the first semiconductor die and an exterior region of the bottom surface of the second semiconductor die;
   at least two of the first plurality of wires runs through the space.

7. The semiconductor package of claim 6 wherein the first plurality of die bond pads are arrayed in a rectangular shape on an exterior region of the top surface of the first semiconductor die.

8. The semiconductor package of claim 6 wherein the second plurality of die bond pads are arrayed in a rectangular shape on an exterior region of the top surface of the second semiconductor die.

9. The semiconductor package of claim 6 wherein:
   the plurality of substrate bond pads comprises a first group of substrate bond pads and a second group of substrate bond pads which are interleaved with one another;
   each of the first plurality of wires is connected to a corresponding one of the first group of substrate bond pads; and
   each of the second plurality of wires is connected to a corresponding one of the second group of substrate bond pads.

10. The semiconductor package of claim 1 wherein the first wire is attached to both the first bond pad and the first one of the plurality of substrate bond pads.

11. The semiconductor package of claim 10 wherein the second wire is attached to both the second bond pad and the second one of the plurality of substrate bond pads.

12. The semiconductor package of claim 1 wherein:
   the substrate has a bottom surface having a plurality of solder balls thereon;

the substrate has a plurality of vias therein; and each of the plurality of substrate bond pads is electrically connected to one of the plurality of solder balls through at least one of the plurality of vias.

13. A semiconductor package comprising:
- a packaging substrate having a top surface having a plurality of substrate bond pads thereon;
- a first semiconductor die having a top surface and a bottom surface and having a first bond pad and a third bond pad, both on its top surface, wherein the first semiconductor die is mounted to the substrate such that the bottom surface of the first semiconductor die faces the top surface of the substrate;
- a first wire connecting the first bond pad to a first one of the plurality of substrate bond pads;
- a second semiconductor die having a top surface and a bottom surface, and having a second bond pad on its top surface and a fourth bond pad on its bottom surface; and
- an interposer disposed between the first semiconductor die and the second semiconductor die such that a space exists between the top surface of the first semiconductor die and the bottom surface of the second semiconductor die and comprising an electrically conductive material electrically coupled to the third bond pad and fourth bond pad, wherein at least a portion of the first wire passes through the space between the top surface of the first semiconductor die and the bottom surface of the second semiconductor die.

14. The semiconductor package of claim 13 wherein the second bond pad is electrically connected to the substrate by a second wire connected to the second bond pad and a second one of the plurality of substrate bond pads.

15. The semiconductor package of claim 14 wherein the second wire is attached to both the second bond pad and a second one of the plurality of substrate bond pads.

16. The semiconductor package of claim 13 wherein the first wire is attached to both the first bond pad and the first one of a plurality of die bond pads.

17. The semiconductor package of claim 13 wherein:
- the substrate has a bottom surface having a plurality of solder balls thereon;
- the substrate has a plurality of vias therein; and
- each of the plurality of substrate bond pads is electrically connected to one of the plurality of solder balls through at least one of the plurality of vias.

18. The semiconductor package of claim 13 wherein:
- the first bond pad is one of a first plurality of die bond pads on the top surface of the first semiconductor die;
- the first wire is one of a first plurality of wires, each of the first plurality of wires connecting a corresponding one of the first bond pad to a corresponding one of the plurality of substrate bond pads;
- the second bond pad comprises a second plurality of die bond pads on the top surface thereof;
- each of a second plurality of wires connects a corresponding one of the second bond pads to a corresponding one of the plurality of substrate bond pads; and
- at least two of the first plurality of wires runs through the space between the top surface of the first semiconductor die and the bottom surface of the second semiconductor die.

19. The semiconductor package of claim 18 wherein the first plurality of die bond pads are arrayed in a rectangular shape on an exterior region of the top surface of the first semiconductor die.

20. The semiconductor package of claim 18 wherein the second plurality of die bond pads are arrayed in a rectangular shape on an exterior region of the top surface of the second semiconductor die.

21. The semiconductor package of claim 18 wherein:
- the plurality of substrate bond pads comprises a first group of substrate bond pads and a second group of substrate bond pads which are interleaved with one another;
- each of the first plurality of wires is connected to a corresponding one of the first group of substrate bond pads; and
- each of the second plurality of wires is connected to a corresponding one of the second group of substrate bond pads.

22. The semiconductor package of claim 13 further comprising a thermally conductive adhesive disposed between the bottom surface of the first semiconductor die and the top surface of the substrate.

23. A semiconductor package comprising:
- a packaging substrate having a top surface having a plurality of substrate bond pads thereon;
- a first semiconductor die having a top surface and a bottom surface and having a first bond pad and a third bond pad on its top surface;
- a first wire connecting the first bond pad to a first one of the plurality of substrate bond pads;
- a second semiconductor die having a top surface and a bottom surface and having a second bond pad on its top surface and a fourth bond pad on its bottom surface, the second semiconductor die electrically connected to the substrate, wherein:
  - at least a portion of the first semiconductor die is in between the second semiconductor die and the substrate such that at least a portion of the top surface of the first semiconductor die faces the bottom surface of the second semiconductor die; and
  - the surface area of the top surface of the first semiconductor die is not more than 16 mm$^2$ greater than the surface area of the bottom surface of the second semiconductor die; and
- an interposer comprising an electrically conductive material attached to both the third bond pad and the fourth bond pad and disposed between the first semiconductor die and the second semiconductor die such that a space exists between the top surface of the first semiconductor die and the bottom surface of the second semiconductor die.

24. The semiconductor package of claim 23 wherein at least a portion of the first wire passes through the space between the top surface of the first semiconductor die and the bottom surface of the second semiconductor die.

25. The semiconductor package of claim 23 wherein the second bond is electrically connected to the substrate by a second wire connected to the second bond pad and a second one of the plurality of substrate bond pads.

26. The semiconductor package of claim 25 wherein the second wire is attached to both the second bond pad and a second one of the plurality of die bond pads.

27. The semiconductor package of claim 23 wherein the first wire is attached to both the first bond pad and a first one of the plurality of die bond pads.

28. The semiconductor package of claim 23 wherein:
- the substrate has a bottom surface having a plurality of solder balls thereon;
- the substrate has a plurality of vias therein; and each of the plurality of substrate bond pads is electrically connected to one of the plurality of solder balls through at least one of the plurality of vias.

29. The semiconductor package of claim 23 wherein:

the first bond pad is one of a first plurality of die bond pads on the top surface of the first semiconductor die;

the first wire is one of a first plurality of wires, each of the first plurality of wires connecting a corresponding one of the first bond pad to a corresponding one of the plurality of substrate bond pads;

the second bond pad comprises a second plurality of die bond pads on the top surface thereof;

each of a second plurality of wires connects a corresponding one of the second bond pads to a corresponding one of the plurality of substrate bond pads; and at least two of the first plurality of wires runs through the space between the top surface of the first semiconductor die and the bottom surface of the second semiconductor die.

30. The semiconductor package of claim 29 wherein the first plurality of die bond pads are arrayed in a rectangular shape on an exterior region of the top surface of the first semiconductor die.

31. The semiconductor package of claim 29 wherein the second plurality of die bond pads are arrayed in a rectangular shape on an exterior region of the top surface of the second semiconductor die.

32. The semiconductor package of claim 29 wherein:

the plurality of substrate bond pads comprises a first group of substrate bond pads and a second group of substrate bond pads which are interleaved with one another;

each of the first plurality of wires is connected to a corresponding one of the first group of substrate bond pads; and each of the second plurality of wires is connected to a corresponding one of the second group of substrate bond pads.

33. The semiconductor package of claim 23 wherein the electrically conductive material comprises an adhesive.

34. The semiconductor package of claim 23 wherein the first semiconductor die is mounted to the substrate such that the bottom surface of the first semiconductor die faces the top surface of the substrate.

35. The semiconductor package of claim 34 further comprising a thermally conductive adhesive disposed between the bottom surface of the first semiconductor die and the top surface of the substrate.

36. A semiconductor package comprising:

a packaging substrate having a top surface having a plurality of substrate bond pads thereon;

a first semiconductor die having a top surface and a bottom surface and having a first bond pad and a third bond pad on its top surface, wherein the first semiconductor die is mounted to the substrate such that the bottom surface of the first semiconductor die faces the top surface of the substrate;

a first wire connecting the first bond pad to a first one of the plurality of substrate bond pads;

a second semiconductor die having a top surface and a bottom surface and having a second bond pad on its top surface and a fourth bond pad on its bottom surface;

an electrically conducting separating means for separating the first semiconductor die from the second semiconductor die and electrically connecting the third bond pad and the fourth bond pad such that a space exists between the top surface of the first semiconductor die and the bottom surface of the second semiconductor die; wherein at least a portion of the first wire passes through the space between the top surface of the first semiconductor die and the bottom surface of the second semiconductor die.

37. The semiconductor package of claim 36 wherein the electrically conducting separating means comprises an interposer.

* * * * *